United States Patent [19]

Le Bars

[11] Patent Number: 5,574,404

[45] Date of Patent: Nov. 12, 1996

[54] OPTICAL COUPLER GALVANIC ISOLATION DEVICE, AND MODEM INCORPORATING IT

[75] Inventor: Philippe A. Le Bars, Elancourt, France

[73] Assignee: Apple Computer, Inc., Cupertino, Calif.

[21] Appl. No.: 381,957

[22] PCT Filed: Jun. 10, 1994

[86] PCT No.: PCT/IB94/00152

§ 371 Date: Apr. 28, 1995

§ 102(e) Date: Apr. 28, 1995

[87] PCT Pub. No.: WO94/29950

PCT Pub. Date: Dec. 22, 1994

[30] Foreign Application Priority Data

Jun. 14, 1993 [FR] France ................................. 93 07129

[51] Int. Cl.⁶ .......................... H03F 17/00; H04M 11/00
[52] U.S. Cl. ...................... 330/308; 250/214 A; 379/90; 379/405
[58] Field of Search ................ 330/59, 308; 250/214 A; 379/90, 97, 399, 405

[56] References Cited

U.S. PATENT DOCUMENTS 3,955,149  5/1976  Trilling ................................. 330/30 D
4,516,020  5/1985  Simpson et al. ..................... 250/214 L

OTHER PUBLICATIONS

Patent Abstracts of Japan, vol. 17, No. 50 (E–1314) 29 Jan. 1993.

*Primary Examiner*—James B. Mullins
*Attorney, Agent, or Firm*—Blakely Sokoloff Taylor & Zafman

[57] ABSTRACT

A galvanic isolation device having a light-emitting diode and a photo-transistor. A control circuit, which is coupled to the light-emitting diode and which controls the light-emitting diode, is provided. A signal generator circuit, which is coupled to the photo-transistor, is also provided. The signal generator circuit includes a fixed-gain amplifier circuit that is coupled to a current path formed by a collector electrode and an emitter electrode of the photo-transistor. A biasing circuit, which is coupled to a base electrode of the photo-transistor, biases the photo-transistor into a saturated state.

12 Claims, 1 Drawing Sheet

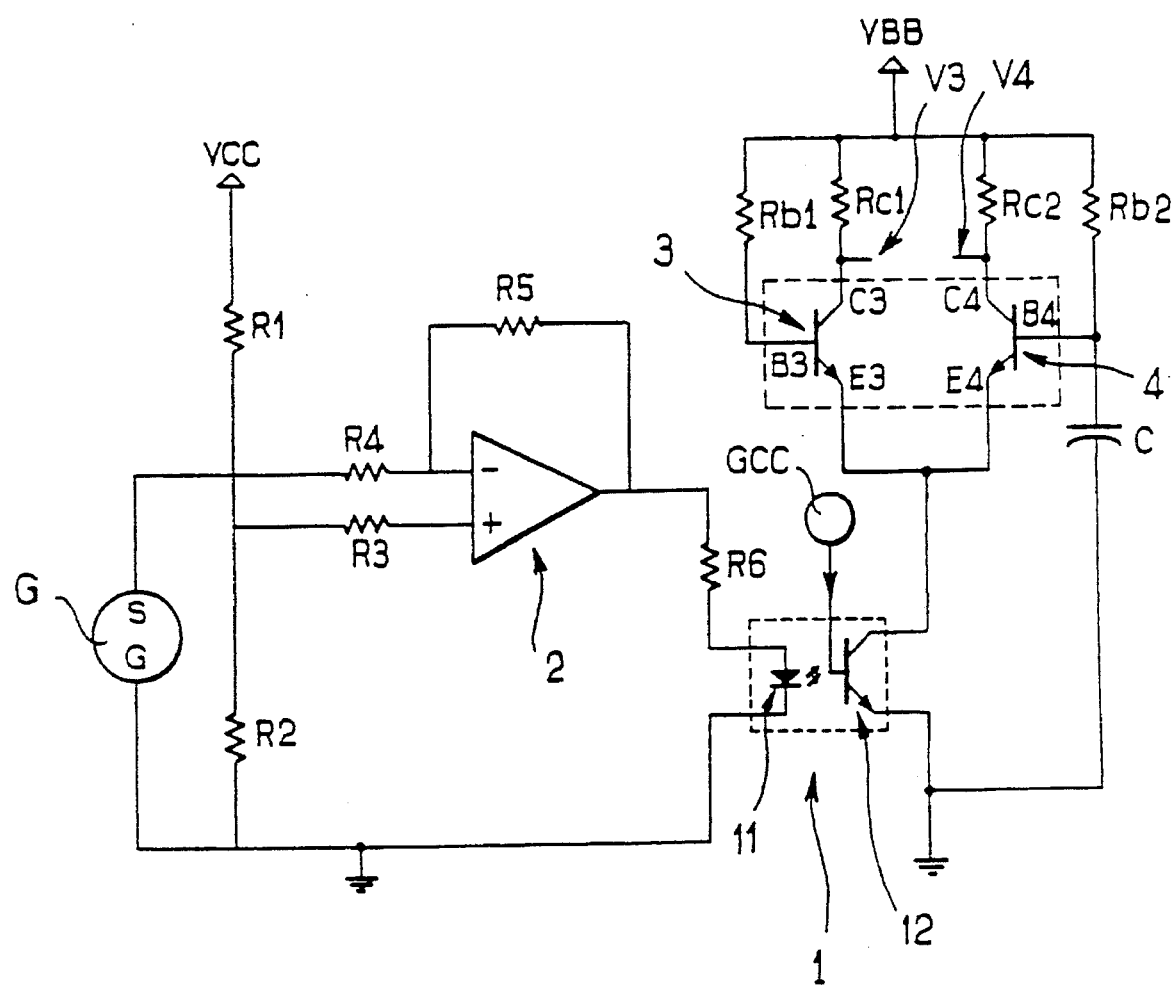

OPTICAL COUPLER GALVANIC ISOLATION DEVICE, AND MODEM INCORPORATING IT

BACKGROUND OF THE INVENTION

1. Field of the Invention

The present invention relates to a galvanic isolation device for a modem, of the type comprising an optical coupler, specially adapted to ensure galvanic isolation between a modem of a portable micro-computer and a telephone line.

2. Description of the Prior Art

It is well known that, in the case in which equipment fed with current by the mains voltage is intended to be connected to the telephone network, the "Postes et Télécommunications" (PTT) regulations demand galvanic isolation between the equipment and the telephone network, for example resisting a voltage of 2500 volts, in order not to damage the telephone lines in the case in which a high voltage, due to a defect in the equipment, a storm, etc . . . appears in the circuits of the equipment.

Conventionally, in the case of a modem or modem card coupled to an office or portable computer, the galvanic isolation between the modem and the telephone line is achieved by means of a transformer. Such a component has the advantage of not consuming current and of having transfer characteristics which vary little in time. However, the transformers used, in order to retain good linearity, are necessarily bulky and heavy, which gives rise to housing problems when incorporating the modem in the computer, particularly in a compact or portable personal computer. The weight of a computer is also substantially increased. Furthermore, due to their inductive structure, transformers are very prone to high frequency interference.

Certain manufacturers have already attempted to overcome these disadvantages by producing galvanic isolation between the telephone network and the modem by means of optical couplers.

However, the use of an optical coupler gives rise to certain technical difficulties. Firstly, the transfer characteristic of an optical coupler can vary widely in time due to an ageing phenomenon, particularly of its light-emitting diode. Furthermore, in a same series of optical couplers, the value of the current gain of the photo-transistor varies greatly from one optical coupler to another, as it does generally in all transistors. Typically, this gain can vary between 100 and 400.

Because of these spreads, the value of the analog voltage applied to the telephone line therefore also varies greatly, which is unacceptable with respect to the PTT regulations.

A known solution to this disadvantage related to the spread of transfer characteristics of the optical couplers can consist in coupling each optical coupler with an adjustable-gain amplification stage, and in adjusting the gain of this stage, case by case, in order to compensate the response variations of the optical coupler. However, this solution is not compatible with the demands of mass production, as an individual adjustment of each modem or modem card is necessary.

Another solution could consist in combining an optical coupler with an automatic gain control circuit (AGC), widely used in radio receivers, particularly in amplitude modulation and frequency modulation receivers. This circuit would make it possible, by modifying the biasing of the light-emitting diode of the optical coupler, to give the complete circuit a constant gain.

Such a solution would however be very difficult to implement because, in order to retain galvanic isolation, the AGC voltage to be applied to the control circuit of the light-emitting diode should be carried out by another optical coupler, for example of the photo-diode type, which would affect the efficiency of the AGC and render the circuit more expensive. Furthermore, a reaction carried out not at the level of the light-emitting diode but in the photo-transistor emitter, would be capable of reducing the spread of gain between one optical coupler circuit and another, but not sufficiently for the considered practical application.

Furthermore, in the case of a photo-transistor, whose current gain would be extremely low, there would be a risk, due to an excessive photonic current, of bringing the photo-transistor into its saturated state, and of thus causing unacceptable distortions in the output signal. In fact, the range of linearity of an optical coupler photo-transistor is traditionally very narrow.

Furthermore, such a circuit should be the subject of the meticulous adaptations or adjustments in the case in which it would be required to use a different type of optical coupler.

SUMMARY OF THE INVENTION

The purpose of the present invention is to overcome these disadvantages by proposing an optical coupler galvanic isolation device in which it is possible to become independent from the current gain spread of the photo-transistor, simply and economically.

Another purpose of the invention is to propose a galvanic isolation device which can function with different types of optical coupler without adaptation.

For this purpose, the present invention relates to a galvanic isolation device, particularly for a computer modem, of the type comprising an optical coupler formed from a light-emitting diode and a photo-transistor, comprising a first control stage for the light-emitting diode, and a second signal output stage, this device being characterized in that it comprises means of biasing of the photo-transistor to make it operate in its saturated state, and in that the output stage comprises a fixed-gain amplifier circuit receiving the collector current of the said photo-transistor.

Preferably, the biasing means comprise means of applying to the base of the photo-transistor a fixed biasing current superimposed on the current of photonic origin.

Advantageously, the output stage comprises a differential amplifier with a pair of bipolar transistors, with the collector of the photo-transistor connected to the emitters of the two bipolar transistors, the bases and the collectors of the two bipolar transistors being connected to a constant dc voltage source via resistors, and the base of one of the bipolar transistors being connected to a reference voltage via a capacitor.

The bipolar transistors are preferably placed in the same package, in order to prevent drifts due to temperature variations. Furthermore, in order to produce a constant-gain integrated galvanic isolation device, the light-emitting diode, the photo-transistor and the two bipolar transistors can very advantageously be placed in the same package.

The invention also relates to a modem, particularly for a portable computer, equipped with a pair of galvanic isolation devices such as defined above and to a portable computer equipped with such a modem.

Other characteristics, purposes and advantages will emerge from the following description, given by way of non-limitative example, with reference to the accompanying drawing showing a circuit diagram of an optical coupler galvanic isolation device according to the invention.

BRIEF DESCRIPTION OF THE DRAWING

The figure illustrates the galvanic isolation device of the present invention.

DETAILED DESCRIPTION

The device shown in the accompanying drawing is a galvanic isolation device, preferably for a modem intended to be incorporated in a portable micro-computer, in order to provide protection of the telephone network from high voltages which can appear accidentally in the circuits of the computer in accordance with a certain number of PTT regulations.

The isolation is achieved by means of an optical coupler 1, conventionally comprising a light-emitting diode (LED) 11 and a photo-transistor 12, optically coupled in the same package. This device comprises a first control stage for the LED 11 of the optical coupler 1, comprising an operational amplifier 2, arranged to superimpose, on an analog voltage to be transmitted through the galvanic isolation device, produced by a generator G, a biasing voltage for the LED 11. This operational amplifier 2 is connected by its positive input terminal to a voltage divider bridge, formed from two resistors R1 and R2, by the intermediary of a third resistor R3. This divider bridge fixes the biasing voltage. The voltage divider bridge is connected to a constant dc voltage source VCC by the resistor R1, and to earth by the resistor R2. The negative terminal of the operational amplifier 2 is connected by a resistor R4 to an output terminal of the generator G. It is also connected to the output of this operational amplifier by a resistor R5. This output delivers a current which passes through a resistor R6, and which energizes the LED 11.

Furthermore, this device comprises a second signal output stage comprising a set of two bipolar transistors 3, 4, of the NPN type connected as differential amplifiers. The emitters E3, E4, of these two transistors 3, 4 are connected together and connected to the collector of the photo-transistor 12. The base B3 and the collector C3 of the transistor 3 are connected to another fixed dc voltage source VBB by the intermediary of the resisters Rb1 and Rc1, respectively. Similarly, the base B4 and the collector C4 of the second transistor 4 are connected to two resisters, Rb2 and Rc2 respectively, which are connected to the voltage VBB. Furthermore, the base of the transistor 4 is connected to earth by the intermediary of a capacitor C. The output voltage of the device, referenced V4-V3, is taken between the two collectors C3 and C4 of the two transistors 3 and 4.

Furthermore, the emitter of the photo-transistor 12 and the cathode of the LED 11 are connected to earth.

The device furthermore comprises a dc current generator GCC intended to apply to the base of the photo-transistor 12 a current which takes it into its saturated state. This current is superimposed, in the photo-transistor, on the current of photonic origin caused by the LED 11.

Furthermore, as illustrated by dashed line, the transistors 3 and 4 are preferably placed in the same package in order that they may be taken to the same temperature.

The functioning of the device is as follows. The output signal of the operational amplifier 2 energizes the light-emitting diode 11 which converts this signal into light radiation. This radiation illuminates the base-collector junction of the photo-transistor 12, and is the source of a corresponding photonic current. The dc current generator connected to the base of the photo-transistor 12 supplies it with a current chosen according to the type of optical coupler used, which is for example of the order of a few dozen milliamps, which is added to the weak biasing of the photonic current (typically 1 to 2 mA) in order to cause the photo-transmitter to function in its saturated state.

It will be observed here that the characteristics of photo-transistors in the saturated state vary little from one type of optical coupler to another. This operating state thus makes it possible to choose the optical coupler rather freely from various types of components. Furthermore as the light-emitting diode 11 is not saturated, the saturation of the photo-transistor limits distortion to a value typically less than 0.5%.

Considering the fact that the photo-transistor operates in the saturated state, its current gain is approximately 0 and the variations in the collector current of the photo-transistor therefore reproduce, with unit gain, the variations in the base current of the photo-transistor, corresponding to the analog signal to be transmitted.

The purpose of the differential amplifier built around the transistors 3 and 4 is to generate, from the collector current of the photo-transistor 12:

- on the collector of the transistor 3, a fixed dc voltage on which is superimposed an analog voltage following the variations of the said collector current, and
- on the collector of the transistor 4, the said fixed dc voltage only, due to the presence of the capacitor C between the base of the transistor 4 and earth.

The difference between the collector potentials V3 and V4 therefore restitutes a purely analog signal corresponding to the analog signal emitted by the generator G, with a constant gain, of the order of that of the differential amplifier (except for the ageing of the LED).

In the case in which this gain would prove to be inadequate, which is possible because the differential amplifier operates in an optimum manner within rather narrow ranges of gain, it is of course possible to provide another amplifier stage of appropriate gain downstream of the latter.

It will be noted here that the circuit such as described above has a low current consumption and can be fed at a relatively low voltage VBB, of the order of a few volts.

Furthermore, as the transistors 3 and 4 are placed in the same package and exposed to the same temperature, the output voltage is consequently independent from drifts of thermal origin.

For the purpose of facilitating the industrialization of a constant-gain galvanic isolation device such as described above, it is also possible to provide for the placing of at least the LED 11, the photo-transistor 12 and the two bipolar transistors 3, 4, or any other equivalent semi-conductor components (as well as the amplifier 2 if necessary) in a common package.

A modem is advantageously provided with two galvanic isolation devices such as described above, disposed in parallel and in opposite directions, in such a way as to ensure both the transmission and reception of modulated data on the telephone line.

The present invention is of course not limited to the embodiment described and shown and various modifications are within the scope of those skilled in the art.

I claim:

1. A galvanic isolation device comprising:
   a) an optical coupler having a light-emitting diode and a photo-transistor, said photo-transistor having a base electrode, collector electrode, and emitter electrode, said collector electrode and emitter electrode forming a current path, said light-emitting diode for creating a current of photonic origin in the base electrode of said photo-transistor;
   b) a control circuit, coupled to the light-emitting diode, said control circuit controlling the light-emitting diode;
   c) a signal generator circuit, coupled to the photo-transistor, said signal generator circuit having a fixed-gain amplifier circuit, said fixed-gain amplifier circuit coupled to the current path of said photo-transistor; and
   d) a biasing circuit, coupled to the base electrode of said photo-transistor, said biasing circuit biasing said photo-transistor into a saturated state.

2. The galvanic isolation device of claim 1, wherein the biasing circuit includes a current generator, said current generator providing a fixed biasing current to the base electrode of said photo-transistor; wherein said fixed biasing current is superimposed on the current of photonic origin.

3. The galvanic isolation device of claim 1 or 2, wherein the signal generator circuit includes a differential amplifier having a pair of bipolar transistors wherein each bipolar transistor includes a base electrode, an emitter electrode and a collector electrode.

4. The galvanic isolation device of claim 3, wherein the collector electrode of the photo-transistor is connected to the emitter electrode of each of the bipolar transistors, the base electrode and the collector electrode of each bipolar transistor is coupled to a constant DC voltage source, and the base electrode of a first bipolar transistor is coupled to a reference voltage.

5. The galvanic isolation device of claim 3, wherein the bipolar transistors are integrated into one package.

6. The galvanic isolation device of claim 5, wherein the light-emitting diode, the photo-transistor and the two bipolar transistors are integrated into a single package.

7. A modem, coupled between a data transmission line and a computer system, said modem comprising:
   a) a first galvanic isolation device for handling reception of data from the data transmission line;
   b) a second galvanic isolation device for handling transmission of data to the data transmission line, wherein said first and second galvanic isolation device are in parallel,
   each galvanic isolation device having
      i) a light-emitting diode and a photo-transistor, said photo-transistor having a base electrode, collector electrode, and emitter electrode, said collector electrode and emitter electrode forming a current path, said light-emitting diode for creating a current of photonic origin in the base electrode of said photo-transistor;
      ii) a control circuit, coupled to the light-emitting diode, said control circuit controlling the light-emitting diode;
      iii) a signal generator circuit, coupled to the photo-transistor, said signal generator circuit having a fixed-gain amplifier circuit, said fixed-gain amplifier circuit coupled to the current path of said photo-transistor; and
      iv) a biasing circuit, coupled to the base electrode of said photo-transistor, said biasing circuit biasing said photo-transistor into a saturated state.

8. The modem of claim 7, wherein the biasing circuit includes a current generator, said current generator providing a fixed biasing current to the base electrode of said photo-transistor; wherein said fixed biasing current is superimposed on the current of photonic origin.

9. The modem of claim 7 or 8, wherein the signal generator circuit includes a differential amplifier having a pair of bipolar transistors wherein each bipolar transistor includes a base electrode, an emitter electrode and a collector electrode.

10. The modem of claim 9 wherein the collector electrode of the photo-transistor is connected to the emitter electrode of each of the bipolar transistors, the base electrode and the collector electrode of each bipolar transistor is coupled to a constant DC voltage source, and the base electrode of a first bipolar transistor is coupled to a reference voltage.

11. The modem of claim 9, wherein the bipolar transistors are integrated into one package.

12. The modem of claim 11, wherein the light-emitting diode, the photo-transistor and the two bipolar transistors are integrated into a single package.

* * * * *